(12) United States Patent
Brower et al.

(10) Patent No.: US 7,309,260 B2
(45) Date of Patent: Dec. 18, 2007

(54) WIRELESS COMMUNICATION MODULE

(75) Inventors: Charles J. Brower, Irvine, CA (US); Curtis D. Brown, Dove Canyon, CA (US); Daryl R. Miller, Rancho Santa Margarita, CA (US)

(73) Assignee: Lantronix, Inc., Irvine, CA (US)

( * ) Notice: Subject to any disclaimer, the term of this patent is extended or adjusted under 35 U.S.C. 154(b) by 0 days.

(21) Appl. No.: 11/084,342

(22) Filed: Mar. 17, 2005

(65) Prior Publication Data

US 2005/0181643 A1 Aug. 18, 2005

Related U.S. Application Data

(63) Continuation-in-part of application No. 11/060,664, filed on Feb. 17, 2005, now Pat. No. 7,018,242, which is a continuation of application No. 10/122,867, filed on Apr. 15, 2002, now Pat. No. 6,881,096.

(51) Int. Cl.
*H01R 24/00* (2006.01)
(52) U.S. Cl. ............................................. 439/676
(58) Field of Classification Search ............... 439/676, 439/76.1; 370/278, 466; 340/438; 455/569, 455/569.2
See application file for complete search history.

(56) References Cited

U.S. PATENT DOCUMENTS

| | | | | |
|---|---|---|---|---|
| 6,603,394 | B2* | 8/2003 | Raichle et al. | 340/438 |
| 6,636,749 | B2* | 10/2003 | Holmes et al. | 455/569.2 |
| 6,875,051 | B2* | 4/2005 | Pizak | 439/535 |
| 7,006,851 | B2* | 2/2006 | Holmes et al. | 455/569.2 |
| 7,025,627 | B2* | 4/2006 | Rosenthal et al. | 439/501 |
| 2002/0075816 | A1* | 6/2002 | Beckwith | 370/278 |
| 2002/0090001 | A1* | 7/2002 | Beckwith | 370/466 |
| 2003/0031138 | A1* | 2/2003 | Beckwith | 370/278 |

* cited by examiner

Primary Examiner—Chandrika Prasad
(74) Attorney, Agent, or Firm—Hani Z. Sayed; Rutan & Tucker, LLP

(57) ABSTRACT

A PCB mountable module includes logic circuitry that translates between serial and wireless communication protocols. Supported standards include I2C, CAN, ProfiBus, SPI, and USB, IP, ARP, UDP, TCP, ICMP, Telnet, TFTP, AutoIP, DHCP, HTTP, and SNMP. Modules can optionally provide security, MILARRS functionality, and web related services such as email alert. The novel modules can be used wherever a device designer wants a plug-in (or "drop-in") system that obviates the need for independent development and maintenance of wireless capability. Examples include servers, desktop and laptop computers, and even devices such as kitchen appliances with relatively simpler electronics.

25 Claims, 9 Drawing Sheets

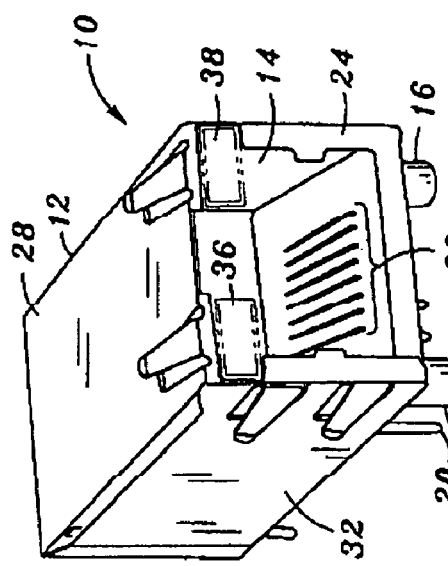
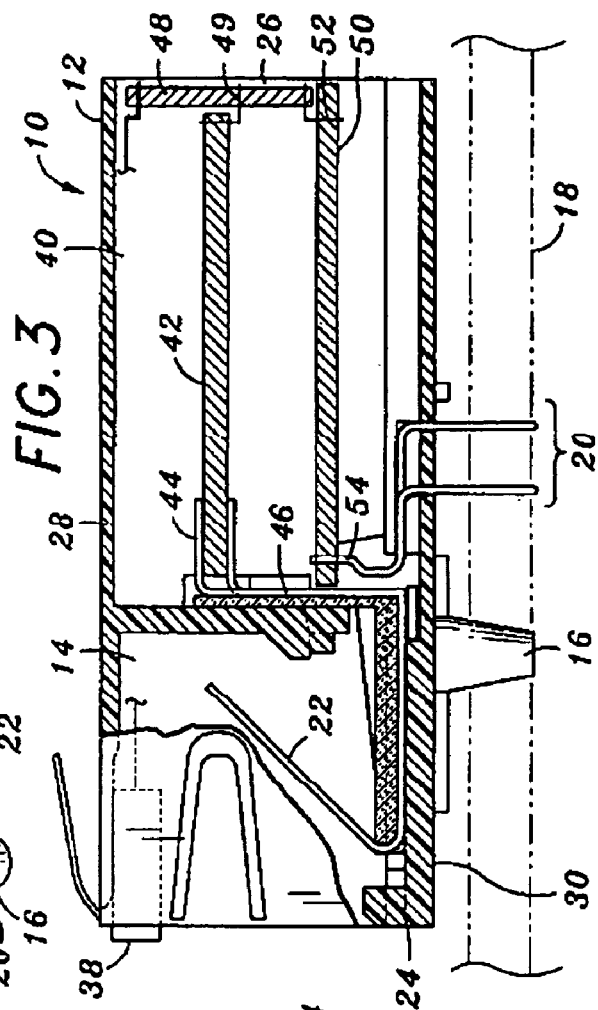
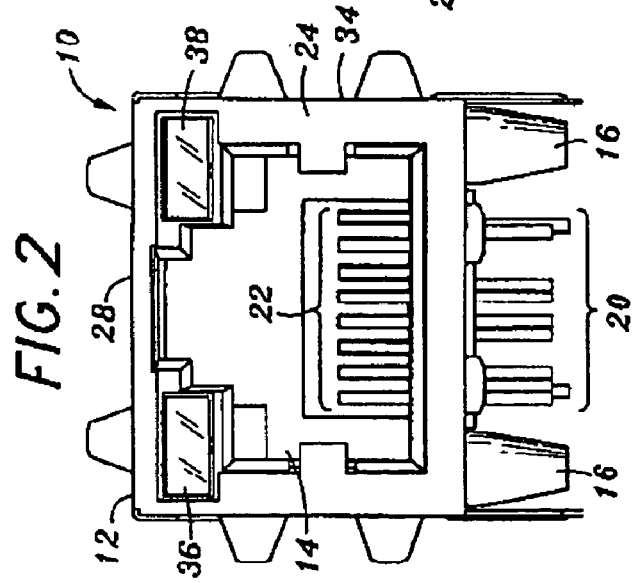

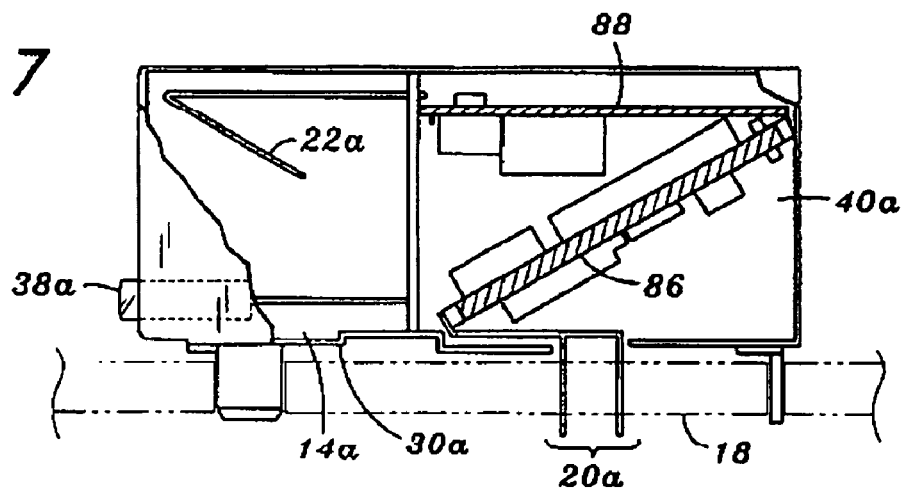
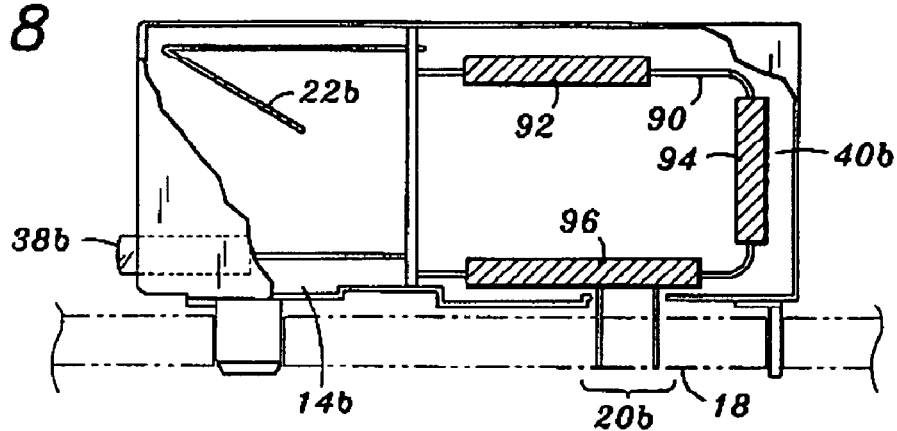
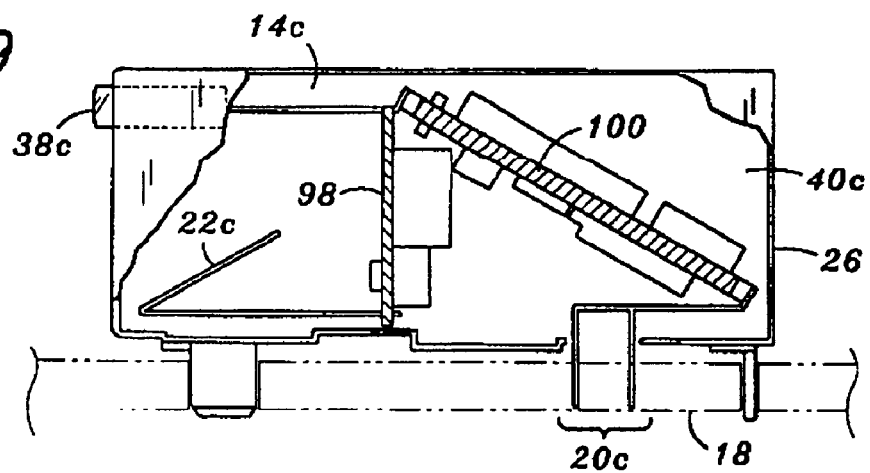

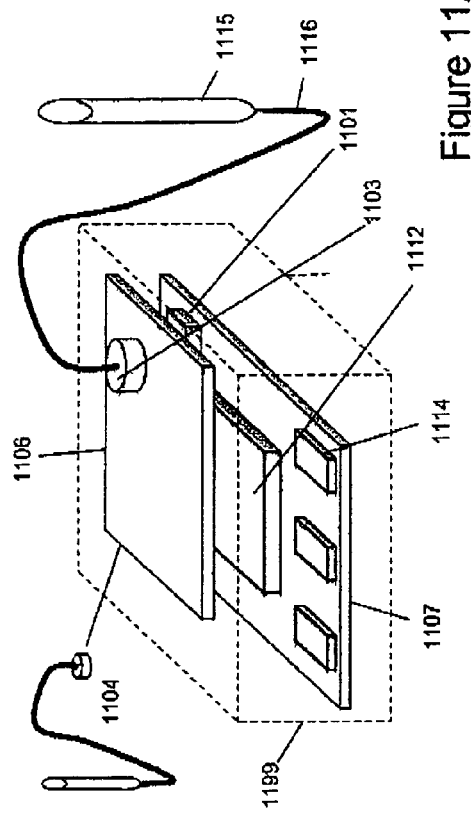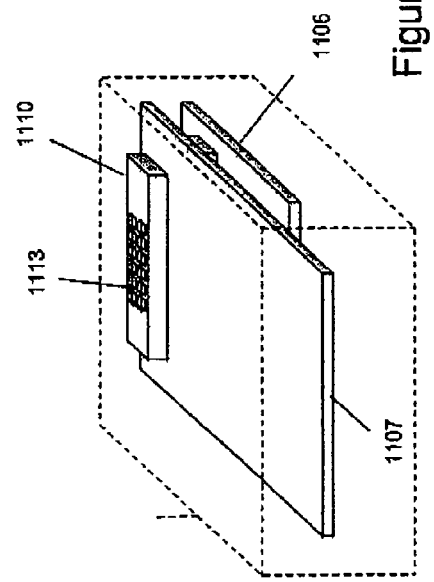

WIRELESS COMMUNICATION MODULE

CROSS-REFERENCE TO RELATED APPLICATIONS

This application is a continuation-in-part of Ser. No. 11/060,664 filed Feb. 17, 2005 now U.S Pat No. 7,018,242, which is a continuation of Ser. No. 10/122,867 filed Apr. 15, 2002 now U.S Pat No. 6,881,096.

FIELD OF THE INVENTION

The field of the invention is wireless adapters.

BACKGROUND OF THE INVENTION

Several serial to Ethernet converters are known, including for example the X-Port™ from Lantronix™, aspects of which were described in the Ser. No. 10/122,867 application filed April 2002. This and all other patents and patent applications cited herein are incorporated by reference in their entirety. A more recent example includes the CP/COM™ converter available from Arc Electronics™. (www.arcelect.com).

The earliest Ethernet converters did not provide wireless connectivity. Subsequent converters, including PCMCIA cards and USB dongles, do provide wireless connectivity, but such devices are not designed for surface installation on computer or other circuit boards. In addition, the existing converters are designed for particular translations of one protocol to another or they have limited or non-existing MILARRS and other functionality. PCMCIA cards, for example, are designed to require a complex parallel interface (e.g. CARDBUS) not typically provided on non-computer products or devices. Existing wireless connectivity devices are therefore not generally suitable to OEM manufacturers for use in their products.

Thus, there is an ongoing need to provide an electronic component board mountable modules that provide wireless connectivity, especially those that use a simple serial interface to the component board. There is also an ongoing need to provide modules that provide web server and other more advanced functionality.

SUMMARY OF THE INVENTION

The present invention provides methods and apparatus in which a module has: an electronic component board mountable housing that includes a logic circuitry that translates between a serial communication protocol and a wireless communication protocol; a physical connector for connection to the board; and a connector to an antenna.

The housing can comprise any suitable size and shape, an especially contemplated embodiment of which has a cross-section of a typical RJ45 connector. Other contemplated embodiments are flatter and wider, with an especially preferred embodiment having a substantially square horizontal cross-section, and a height about 20% of the length or width. Pins are the currently preferred connectors for electrical coupling to the board, and the module can be connected to the board either directly or through an intermediate connector piece. As used herein, the term "mounted on the board" contemplates both types of situations, direct and indirect mounting. Pins can be soldered to form a permanent connection if desired. Any suitable number of pins can be used, from 2 or 3 through 7, 8, or 9, and even more.

The circuitry is preferably disposed on a single chip, although it can be split among multiple components. Preferred modules contain flash or other high speed RAM, at least 256 KB to store an operating system, and at least 2 MB of additional memory to store firmware, web pages, and so forth. Preferred modules can advantageously include a voltage supervisory circuit that uses a power feed of no more than 5 Volts DC, although higher and lower power feeds are contemplated as required by the circuitry. Currently, the most preferred voltage is 3.3 V.

Modules are preferably general purpose, being designed to accommodate any serial communication protocol. This includes especially 12C, CAN, ProfiBus, SPI, and USB. Similarly, modules are preferably designed to handle any suitable serial and management standards, including for example, IP, ARP, UDP, TCP, ICMP, Telnet, TFTP, AutoIP, DHCP, HTTP, and SNMP. It is especially contemplated that modules will comply with any of the 802.11x or superseding standards.

Commercial embodiments preferably include software that provide functionality other than simply protocol translation and wireless networking support. For example, the software can advantageously provide a security function such as WEP (Wired Equivalent Protocol) and WPA (Wireless Networking Protected Access) security, and various types of encryption. Software can also provide at least one of a MILARRS functionality. In other examples, the software can provide web related services such as email alert.

An antenna can be fixedly or detachably coupled to the antenna connector, and can be mounted at the module, or external to the module using a coaxial or other suitable cable. Multiple antennas are also contemplated.

The novel modules can be used wherever a device designer wants a plug-in (or "drop-in") system that obviates the need for independent design, development and maintenance of wireless capability. Examples include servers, desktop and laptop computers, and even devices such as kitchen appliances with relatively simpler electronics. It is especially contemplated that the novel modules can be used on devices having one or more rigid or flexible component boards, and can be implemented with more than one such module on a given board to provide redundancy, or to provide intra- or inter-board communication.

Various objects, features, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a front perspective view of a PCB board mountable converter module that uses a wired Ethernet connection.

FIG. 2 is a front view of the module of FIG. 1.

FIG. 3 is a side, partially cut-away view of the module of FIG. 1.

FIG. 7 is a side, partially cut-away view of an alternative embodiment of a module, having horizontal and angles circuit boards.

FIG. 8 is a side, partially cut-away view of an alternative embodiment of a module, having circuit boards placed on a common flexible substrate.

FIG. 9 is a side, partially cut-away view of an alternative embodiment of a module, having vertical and angled circuit boards.

FIG. 11A is a perspective cutaway view of a commercial WiPort™ module.

FIG. 11B is a bottom perspective view of a commercial WiPort™ module.

DETAILED DESCRIPTION OF THE INVENTION

Figure 4:
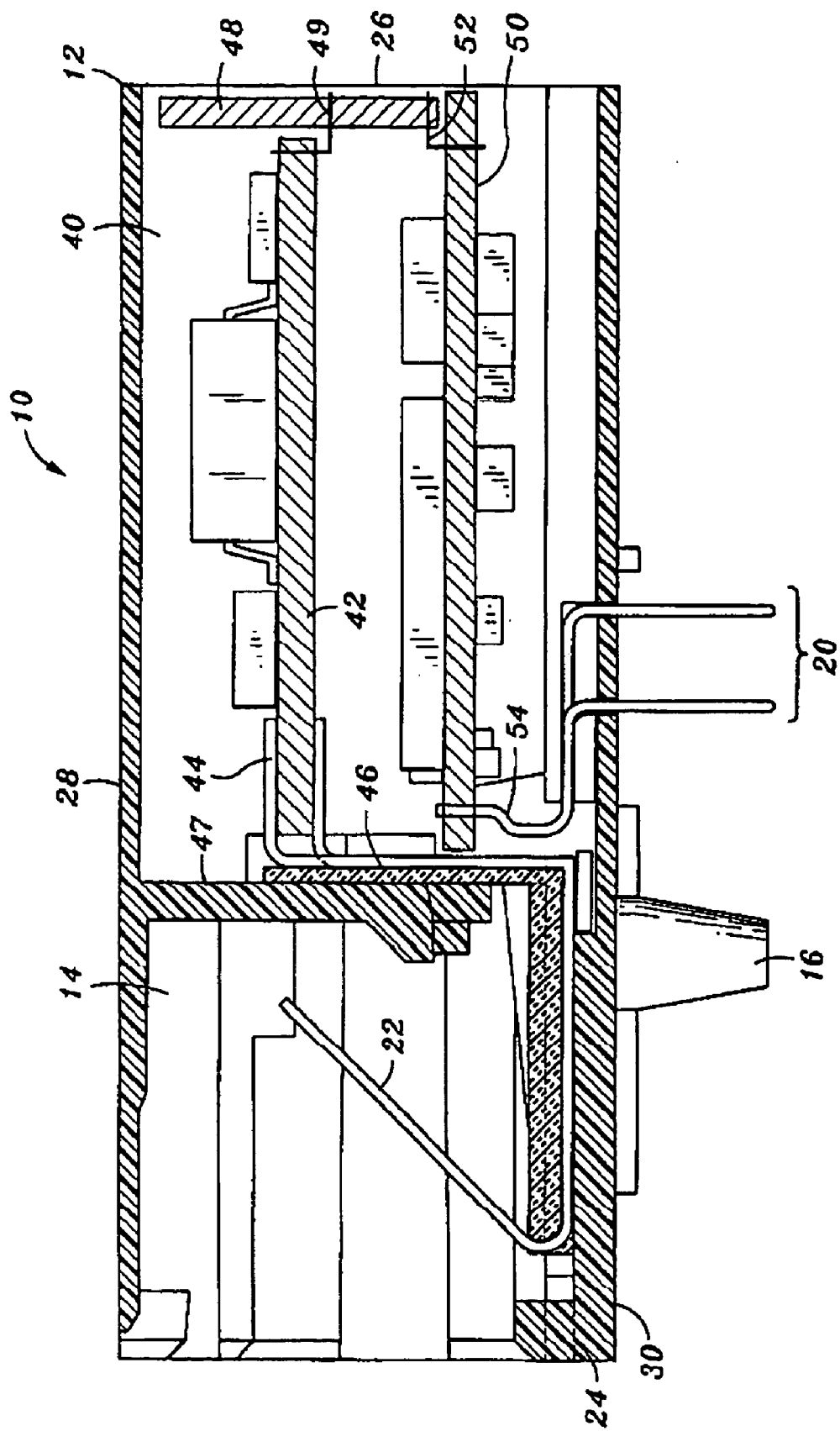
FIG. 4 is a side cross-sectional view of the module of FIG. 1.

In FIGS. 1, 2 and 3, module 10 comprises a generally rectangular housing 12. The front of the housing includes an open cavity 14. A metal Faraday shield covers the top, sides and back of the housing and provides for electromagnetic-radiation (EMR) protection. The module 10 additionally includes spring biased grounding tabs 16 that connect the Faraday shield to chassis (earth) ground by contacting the enclosure in which the connector is mounted. Also shown is an array of leads 20 for electrically interconnecting the module 10 to a printed circuit board (PCB) 18.

The cavity 14 of the housing 12 incorporates a planar array of parallel electrical contacts 22 to provide the necessary electrical contacts to form a connector port within the cavity 14. The cavity 14 is sized and dimensioned and the contacts 22 are placed within the cavity to compliment a mating plug (not shown). The sized cavity 14 along with the contacts 22 form a standard RJ-45 connector jack. The jack contacts 22 are spring biased for engagement with a mating plug (not shown). An important advantage is that novel modules as set forth herein can attach a conventional RJ-45 jack with magnetics, because the Ethernet wires are brought out of the multipin connector.

The housing 12 is formed of molded plastic or other suitable material used in the art, covered by a Faraday shield having a front wall 24, a rear wall 26, a top wall 28, a bottom wall 30, and sidewalls 32 and 34. The references herein to "top", "bottom", and "sides" are made for ease of explanation relative to the drawing. Alternative embodiments eliminate the plastic, and the housing material is chosen to perform the Faraday shielding function without separate components, for example by using conductive metal. It is also contemplated that the module 10 can be oriented in a multitude of ways on a product, thereby accommodating engineering requirements of specific placements.

The front wall 24 includes LEDs 36 and 38. The LEDs provide visual status and fault information for various functions of the serial-to-Ethernet conversion, such as (but not limited to) Ethernet connection speed, link present/absent, full/half duplex, Ethernet activity, serial port activity, and microcontroller error conditions.

In FIGS. 3 and 4 the housing 12 includes a segregated interior chamber 40. A first PCB 42 is disposed within the interior chamber 40 generally horizontal and parallel relative to the bottom wall 30. The first PCB 42 is soldered (or otherwise electrically connected) to the contact interface 44, which is mounted in a plastic insert. The completed insert assembly slides and snaps into the main housing 12. The contact interface pins 44 are formed such that their ends become the wiper contacts 22. Thus, the first PCB 42 is electrically interconnected to the contacts 22 of the port cavity 14. The contact interface 44 additionally provides structural support to the first PCB 42.

A second PCB 50 is also placed within the interior chamber 40, positioned generally horizontal and in general parallel relation to the bottom wall 30. The third PCB 50 is soldered (or otherwise electrically connected) to the array of leads 54, which are formed such that their ends become the input/output pins 20 (more specifically, these pins 20 connect power and ground, reset, serial data input and output, handshake and flow control lines, and PIO lines) that connect to the user's PCB 20. The array of leads 54 are mounted in a plastic insert. After the third PCB 50 is soldered (or otherwise connected) to the leads 54, the completed insert assembly slides and snaps into the main housing 12.

A third PCB 48 is placed within the interior chamber 40 in a generally vertical orientation, and is generally perpendicular to the other PCBs 42 and 50. PCB 48 is positioned adjacent the rear wall 26 and is structurally and electrically interconnected to the other PCBs 42 and 50 by the formed pins 49 and 52. PCB 48 and formed pins 49 and 52 thus provide the electrical connection between PCBs 42 and 50. The LEDs 38 have leads (not shown) that run close to the top of the enclosure 12, and these leads also connect to holes in PCB 48. This provides the electrical connection between the LEDs 38 and the control PCB 50.

The first, 42, and second PCB 50 collectively incorporate the electronic circuitry component necessary to complete a serial-to-Ethernet conversion of data. PCB 42 includes the magnetics portion of the circuitry which can advantageously include isolation transformers, common mode chokes, termination resistors, and a high voltage discharge capacitor (for ESD and voltage surges). In this implementation, PCB 48 is used solely for electrical interconnection, but it could also be used for circuitry components if required.

PCB 50 incorporates all of the electronic circuitry components necessary for the control function of the serial-to-Ethernet conversion. The electronic components on board PCB 50 include, but are not limited to, a microprocessor and an Ethernet controller (which can advantageously be combined in an ASIC), nonvolatile memory (flash memory in the present invention), voltage regulator, voltage supervisory circuit, crystals, resistors, capacitors, and ferrite or other surface mount beads.

In operation, the complete assembly is mounted on a PCB that is a part of some device or equipment. Serial data and general purpose PIO data flows from the device through the array of leads 20 and is processed by the circuitry collectively incorporated onto PCBs 42, 48 and 50. PCB 42 is interconnected to the contacts 22 which mate with a plug (not shown) to effectively transmit Ethernet data thereto. Ethernet data can also flow from the Ethernet port through wiper contacts 22, be processed by the circuitry collectively incorporated onto PCBs 42, 48 and 50, and flow out as serial data and general purpose PIO data through lead pins 20 into the external device. It is additionally contemplated that the control circuitry, magnetic circuitry and LED circuitry can be interchanged among PCBs 42, 48 and 50 and that component can be positioned on one or both sides of each PCB's 42, 48 and 50.

Figure 5:
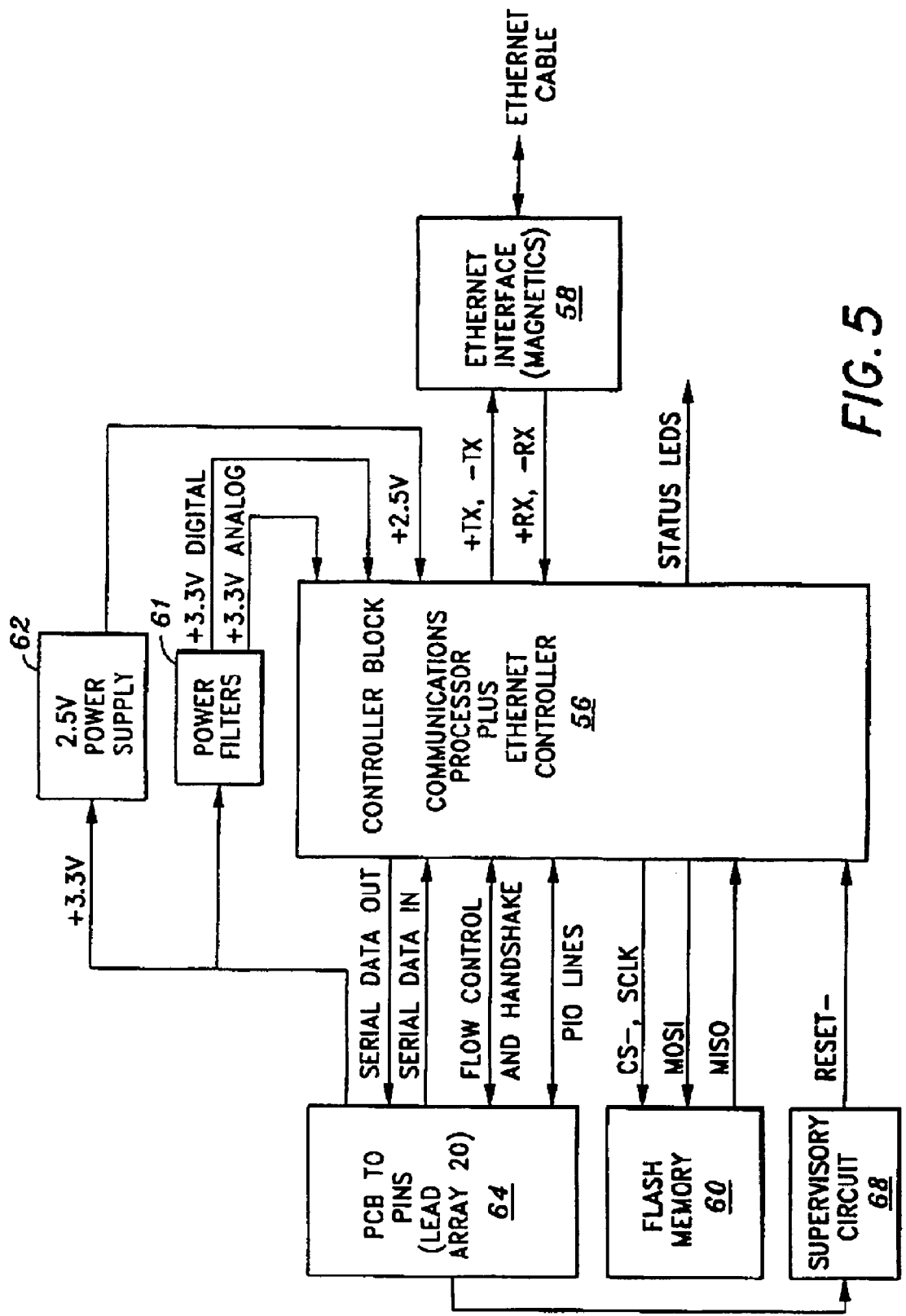
FIG. 5 is a block diagram of the electrical component circuitry for the module of FIG. 1.

In FIG. 5 the controller block 56 handles all of the conversion between serial and Ethernet. This includes processing of the digital (serial) and analog (Ethernet) signals, as well as all of the required code protocol translations. The controller block 56 communicates with Ethernet through the Ethernet interface 58, which is described below in greater detail. The flash memory 66 stores the software that the controller block 56 uses to perform its functions. The supervisory circuit 68 monitors the supply voltage coming in through the PCB IO pins 64. It resets the controller block if the voltage drops too low, or if a signal from the PCB IO pins 64 requests a system reset. The power filters 60 remove noise from the input supply voltage, and also reduce any noise that might be transmitted from the serial-to-Ethernet converter to the outside world through the voltage supply lines. The power supply 62 supplies one or more voltages required by the controller block. Serial data is transmitted to and from the controller block through the PCB IO pins 64 to the external device. The flow control and handshake lines (connected through PCB IO pins 64) are standard signals used to control the serial data stream. The controller block can also communicate with the external device through the PIO lines connecting through the PCB IO pins 64. It is understood that although the components as shown in FIG. 5 are specifically identified, all suitable control circuitry that implement the desired functions are also contemplated.

Figure 6:
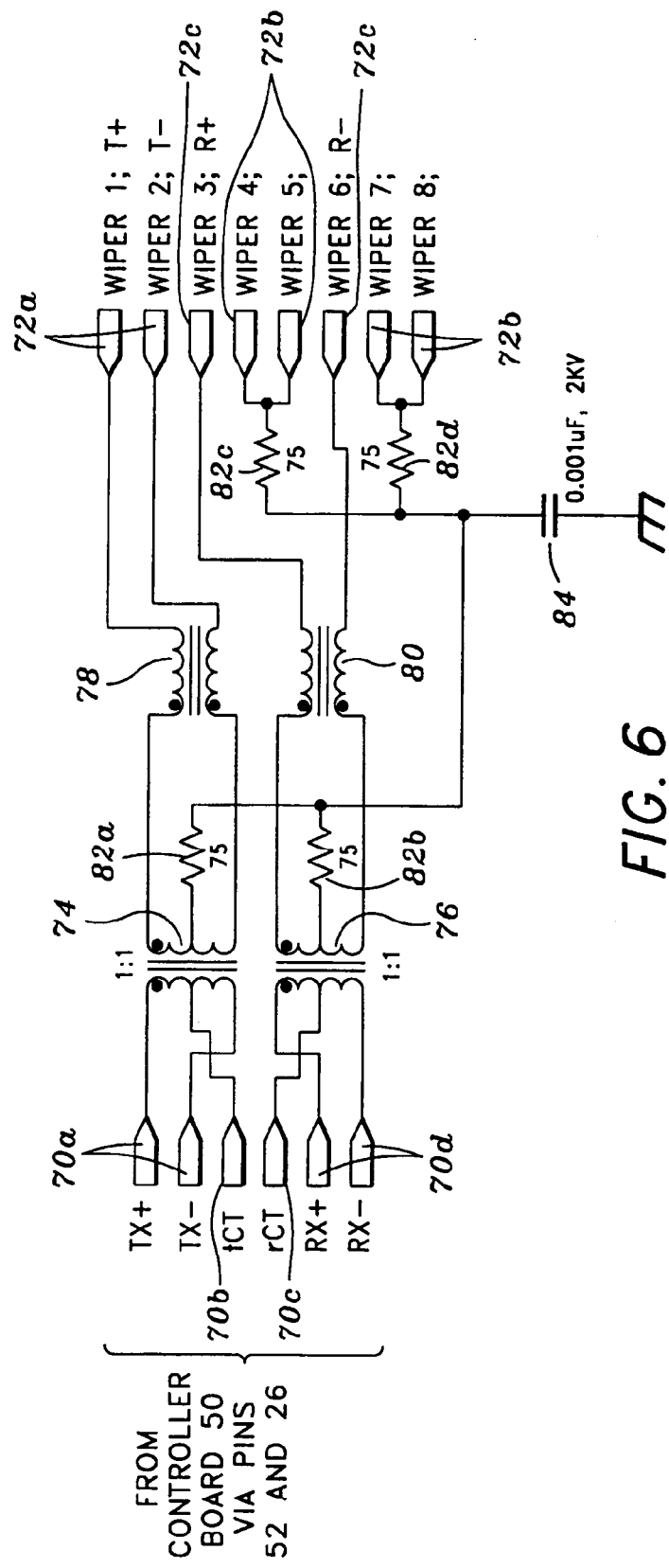
FIG. 6 is a pin input and output diagram of the module of FIG. 1, or a wireless embodiment.

In FIG. 6 the outgoing Ethernet signal 70*a* from the controller 50 passes through the isolation transformer 74, which eliminates any DC coupling problems between Ethernet devices. The outgoing signals pass through the common mode choke 78, which reduces spurious emissions (radiated and conducted). The outgoing signal connects to the Ethernet cable through contacts 72*a* of the RJ-45 jack. Incoming Ethernet signals enter into the jack through contacts 72*c*, and pass through a common mode choke 80 that reduces spurious common mode noise that could be conducted into the device. The signals pass through the isolation transformer 76, and then to the controller board 50 through pins 52 and 26. The center taps 70*b* and 70*c* of the isolation transformers 74 and 76 are used to set the appropriate DC bias levels in the transmit and receive circuitry on the controller board 50. These center taps also connect to the controller board 50 through pins 52 and 26. Four of the RJ-45 contacts 72*c* are not used for Ethernet signals. They are terminated to ground, through matching resistors 82*c* and 82*d* and capacitor 84, to reduce noise and DC transients. DC transients ("ESD") on the Ethernet cable that are present at the contact 72*a* and 72*c* are reduced by discharge to ground through resistors 82*a* and 82*b*.

The alternate module of FIG. 7 is structurally similar to the embodiment shown in FIGS. 1-4, with only the distinctions highlighted below. Within the interior chamber 40*a*, two PCBs 86 and 88 are positioned therein. A first PCB 88 is positioned generally horizontal in parallel relation to the bottom wall 30*a*. A second PCB 86 is positioned in angular relation to the PCB 88 to fit within the interior chamber 40*a*. PCB 86 and 88 collectively incorporate the electric circuitry components to complete a serial to Ethernet data conversion. PCB 86 is interconnected to a lead array 20*a*. PCB 86 includes all of the control circuitry, with components interconnected to the top side and bottom side of said PCB. PCB 86 is interconnected to PCB 88. PCB 88 includes the magnetic portion of the circuitry formed on the underside of PCB 86. The LEDs 38*a* and 36*a* (not shown) also connect to PCB 86 through leads 14*a*. PCB 88 is interconnected to contacts 22*a*.

The alternate module of FIG. 8 is also structurally similar to the embodiment as shown in FIGS. 1-4. However, here a common flexible substrate (more specifically, a rigid/flexible PCB 90, 92, 94, and 96) is formed to fit the interior chamber 40*b*. The rigid/flexible PCB 90, 92, 94, and 96 collectively incorporates the electric circuitry components to complete a serial to Ethernet data conversion. Electrical and magnetic components can be mounted on the rigid portions of the PCB 92, 94, and 96. Electrical connections between the rigid portions 92, 94, and 96 are made on the flexible portions 90. Rigid portion 96 is electrically connected to the lead array 20*b*. Control circuitry can be incorporated onto rigid portion 96 and possibly 94, with magnetic circuitry incorporated on rigid portion 92 and possibly 94. The LEDs connect to rigid portion 96 through leads 14*b*. Rigid portion 92 is electrically connected to contacts 22. It is additionally contemplated that the control circuitry, magnetic circuitry and LED connections can be interchanged among rigid portions 92, 94 and 96.

The alternate module of FIG. 9 is again structurally similar to the embodiment shown in FIGS. 1-4. The main difference is that two PCBs 98 and 100 are positioned within the interior chamber 40*c*. The first PCB 98 is positioned generally vertically in parallel relation to the rear wall 26. A second PCB 100 is positioned in angular relation to the PCB 98 to fit within the interior chamber 40*c*. PCB 98 and 100 collectively incorporate the electric circuitry components to complete a serial-to-Ethernet data conversion. PCB 100 is interconnected to a lead array 20*c*. PCB 100 includes all of the control circuitry with components interconnected to the top side and bottom side of said PCB. PCB 98 is interconnected to PCB 100. PCB 98 includes a magnetic portion of the circuitry. PCB 98 is interconnected to contacts 22*c*. PCB 100 is additionally interconnected to LEDs 38*c* and 36*c*.

Figure 10:
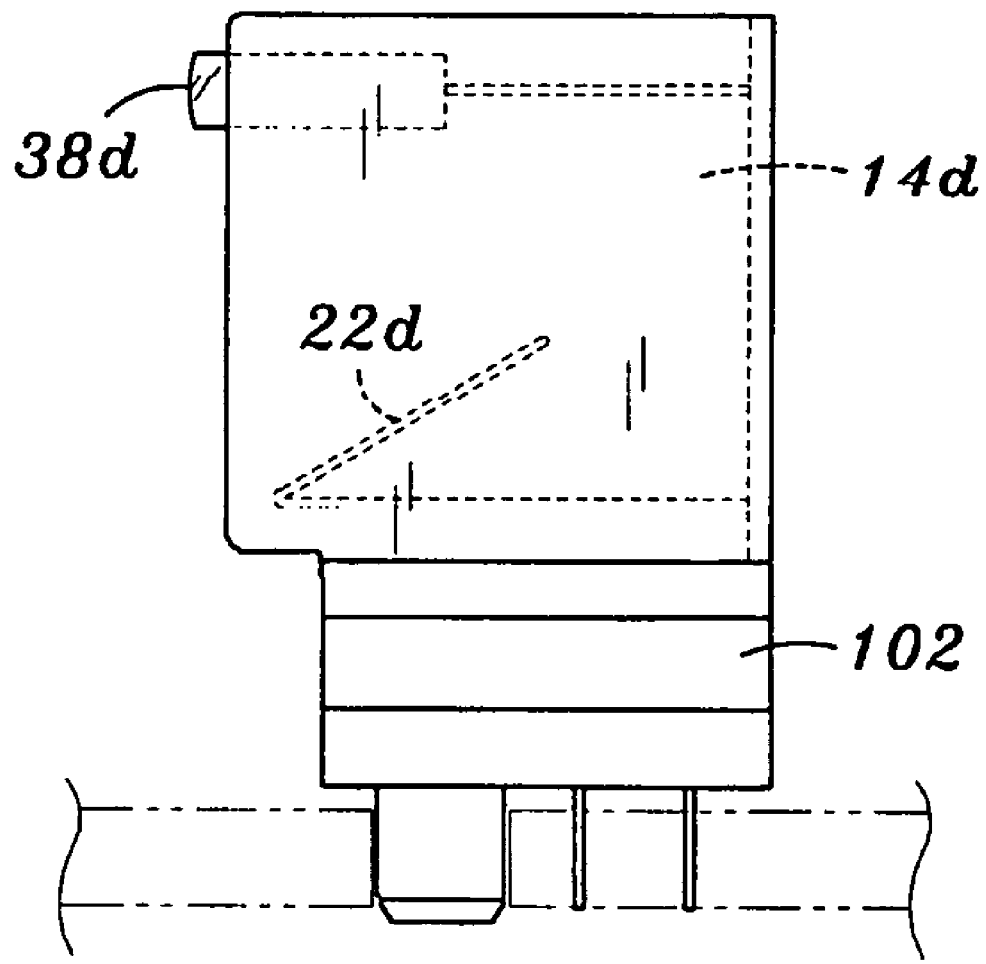
FIG. 10 is an alternative embodiment of a connector, having an interior chamber located beneath the connector port.

The alternate module of FIG. 10 once again includes a connector port that is structurally similar to the embodiment shown in FIGS. 1-4, but which does not include an interior chamber located behind the port. In the alternate embodiment shown in FIG. 10, the interior chamber 102 is located beneath the port cavity 14*d*. Within the interior chamber 102, at least one PCB is positioned therein which incorporates the electric circuitry components to complete a serial-to-Ethernet data conversion. It is contemplated by the present invention that the serial-to-Ethernet circuitry can be incorporated into the interior chamber 102 in a variety of ways, including those described with respect to the interior chambers of FIGS. 4 and 7-9. It is further contemplated that the port cavity 14*d* in any embodiment can be replaced or augmented with a radio antenna, radio antenna connector or remote radio antenna wiring.

Wireless networking versions of the modules of FIGS. 1-10 can be implemented by replacing the magnetics with a suitable radio circuitry and power amplifier, receiver, etc. Such substitutions can be implemented without altering the overall design of the module, but is more preferably implemented using structure and electronics as set forth in FIGS. 11A-C, 12 and 13.

The modules of FIGS. 11A and 11B differ from the embodiment shown in FIGS. 1-4 with major distinctions being the addition of Ethernet radio functionality, which replaces or augments all or a portion of Ethernet magnetic circuitry previously described with respect to PCB boards 42 and 50.

While the partitioning of required circuitry on the interior PCBs within the interior chamber can be accomplished in any suitable manner, it is especially convenient to arrange the Ethernet radio components on a single PCB 1106, with chips 1112, 1114 and remaining control and supervision circuitry on PCB 1107. The board or boards can be positioned in any practical relationship with respect to each other and with respect to the housing. The first PCB 1106 includes antenna connector 1103 and can advantageously provide for a second (diversity) antenna or connector 1104. The second PCB 1107 can alternatively replace leads 54 by including mating connector 1101 for electrical board mounting.

Connector 1101 comprises three or more pins 1113 and can include any or all of serial data pins, handshaking and flow control pins, GPIO pins and pins supporting other serial or parallel protocols as desired. PCB 1107 can also incorporate all of the electronic circuitry components necessary for the control function of the serial-to-Ethernet conversion. There are, of course, a great diversity of pins in use, and additional pin configurations will undoubtedly be utilized in the future. With that caveat in mind, connector 1101 is to be interpreted euphemistically to include all manner of pin Cross sections, square, rectangular, flattened, etc. and all manner of configurations of pins. An important advantage is that novel wireless modules as set forth herein may attach a conventional RJ-45 jack incorporating magnetics, because the Ethernet wires maybe brought out of connector 1101. By including appropriate programming data communication may take place between and among any of the provided interfaces and protocols, including serial, wireless and wired Ethernet interfaces.

The electronic components on PCB 1107 can include, but are not limited to, a microprocessor and an Ethernet controller (combined in an ASIC for the present invention), at least 256 KB of memory that stores an operating system and environment and at least 2 MB of nonvolatile memory that stores at least one web page (flash memory in the present invention), voltage regulator, voltage supervisory circuit, crystals, resistors, capacitors, and ferrite beads (surface mount beads in the present invention).

A current commercial embodiment according to FIGS. 11A and 11B has the following specifications:

| Wireless Specifications | |
|---|---|
| Network Standard | IEEE 802.11 b |
| Frequency Range | 2.412-2.484 GHz |
| Output Power | 14 dBm +/− 1.0 dBm |
| Antenna Connector | 1, no diversity supported. |
| Radio # of Selectable | |
| Channels | 14 Channels |
| Modulation | DSSS, DBPSK, DQPSK, CCK |
| Antenna Connector | 1 |
| Security | WEP 64/128, TKIP |
| Maximum Receive Level | −10 dBm (with PER <8%) |
| Receiver Sensitivity | −82 dBm for 11 Mbps |
| | −87 dBm for 5.5 Mbps |
| | −89 dBm for 2.0 Mbps |
| | −93 dBm for 1.0 Mbps |
| WLAN Power and Link LED Current | Max: 4 mA |
| Other Specifications | |
| CPU, Memory | Lantronix DSTni-EX 186 CPU, 256 KB zero wait state SRAM 2048 KB Flash or 4096 KB Flash, 16 KB Boot ROM, 1024 KB SRAM |
| Firmware | Upgradeable via TFTP and serial port |
| Reset Circuit | Reset In is low active. Minimum reset pulse width is 2 ms at IIL = −500 µA |
| Serial Interface | CMOS (Asynchronous) 3.3 V-level signals Rate is software selectable (300 bps to 921600 bps) |
| Serial Line Formats | 7 or 8 data bits, 1-2 Stop bits, Parity: odd, even, none |
| Modem Control | DTR, DCD |
| Flow Control | XON/XOFF (software), CTS/RTS (hardware), none |
| Network Interface | Wireless 802.11b and 10/100 Ethernet |
| Protocols Supported | 802.11b, ARP, UDP, TCP, Telnet, ICMP, SNMP, DHCP, BOOTP, Auto IP, HTTP, SMTP, TFTP |
| Data Rates With Automatic Fallback | 11 Mbps 5.5 Mbps 2 Mbps 1 Mbps |
| Media Access Control | CSMA/CA with ACK |
| Frequency Range | 2.412-2.484 GHz |
| Range | Up to 328 feet indoors |
| Modulation Techniques | CCK (11 Mbps) CCK (5.5 Mbps) DQPSK (2 Mbps) DBPSK (1 Mbps) |
| Transmit Output Power | 14 dBm ± 1 dBm |
| Average Power Consumption | 1280 mW (WLAN mode; maximum data rate) 820 mW (WLAN mode; idle) 710 mW (Ethernet mode) |
| Peak Supply Current | 460 mA |
| Management | Internal web server, SNMP (read only) Serial login, Telnet login, DeviceInstaller software |

| | -continued |
|---|---|
| Security | Password protection, locking features, 64/128 bit WEP |
| Internal Web Server | Serves web pages |
| | Storage capacity: 1.8 MB or 3.8 MB (depending on Flash size) |
| Weight | 29 grams |
| Material | Metal shell |
| Temperature | Operating range, WLAN: −40° C. to +70° C. |
| | Operating range, Ethernet: −10° C. to +75° C. |
| | Storage range: −40° C. to +85° C. (−40° F. to 185° F.) |
| Included Software | Windows ™ 98/NT/2000/XP based DeviceInstaller configuration software and Windows ™ based Comm Port Redirector, DeviceInstaller, Web-Manager. |

The microprocessor can advantageously implement MILARRS functionality. MILARRS refers to the following: Monitoring the state of the device for an administrator; Inventory the devices sub-systems, components, or assets; Logging data or events generated by the device; Alerting an administrator of device state or taking action based on defined rules; Recovering the device if it fails or shuts down; Reporting device information or diagnostics to an administrator; and Securing the device and its assets from threats and risks. Additional details regarding the acronym and implementation are set forth in U.S. Ser. No. 11/031643, filed Jan. 7, 2005.

Figure 12:
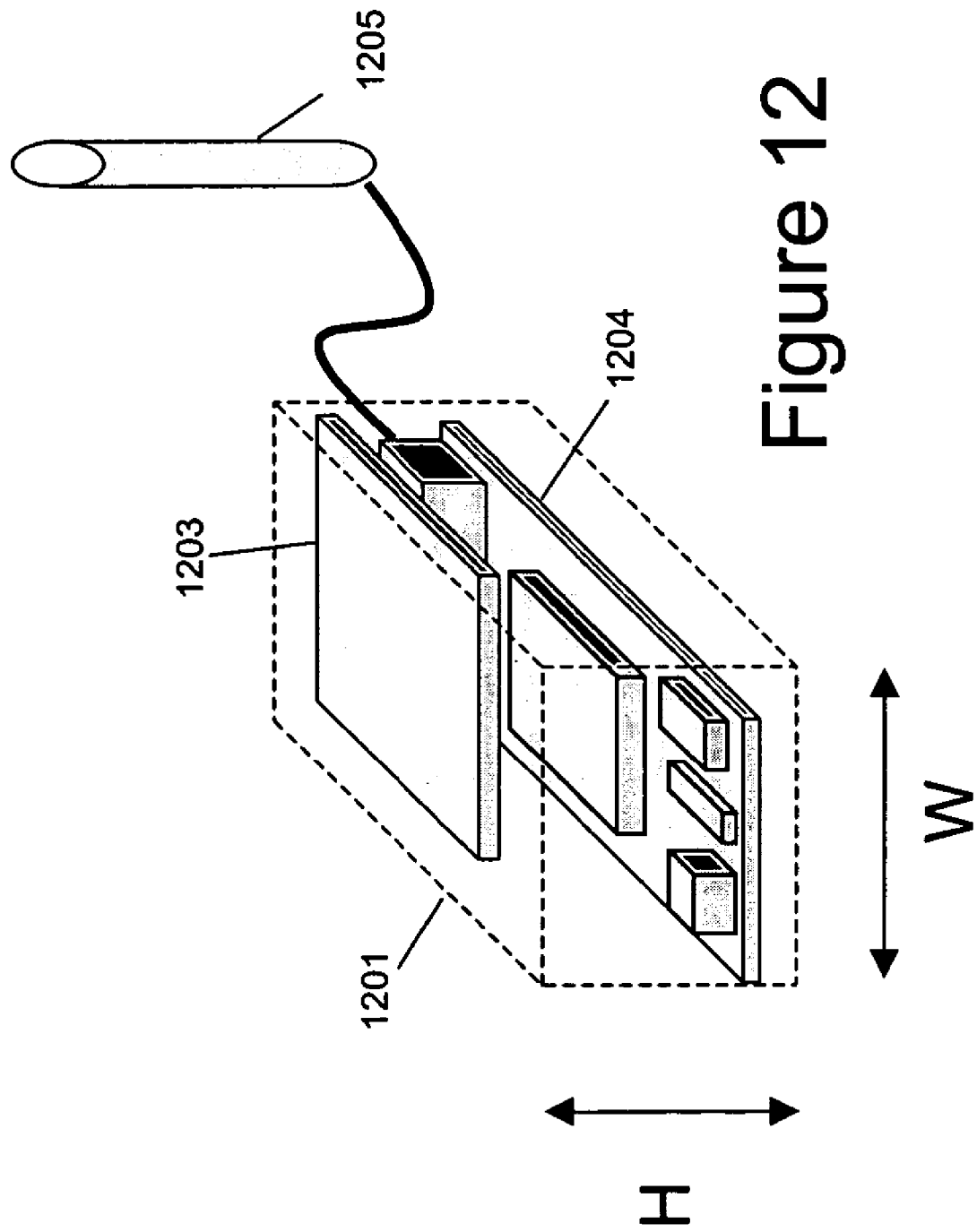
FIG. 12 is a perspective cutaway view of a module in which a serial to wireless Ethernet capability is embodied in a housing having an approximate cross-sectional size and shape of an RJ-45 connector.

In FIG. 12, the housing 1201 can represent a similar form factor in height and width to conventional passive RJ45 jacks, where height can be in a range of 12 to 14 mm or more and width in a range of 15 to 24 mm or more. In a particularly preferred embodiment, height is approximately 13 mm and width is approximately 16 mm. The translation circuitry can be split among multiple components disposed on PCB 1203 and PCB 1204, or even across other boards as can be necessary or desirable. In addition to antenna 1205 a second (diversity) antenna can be provided.

Figure 13:
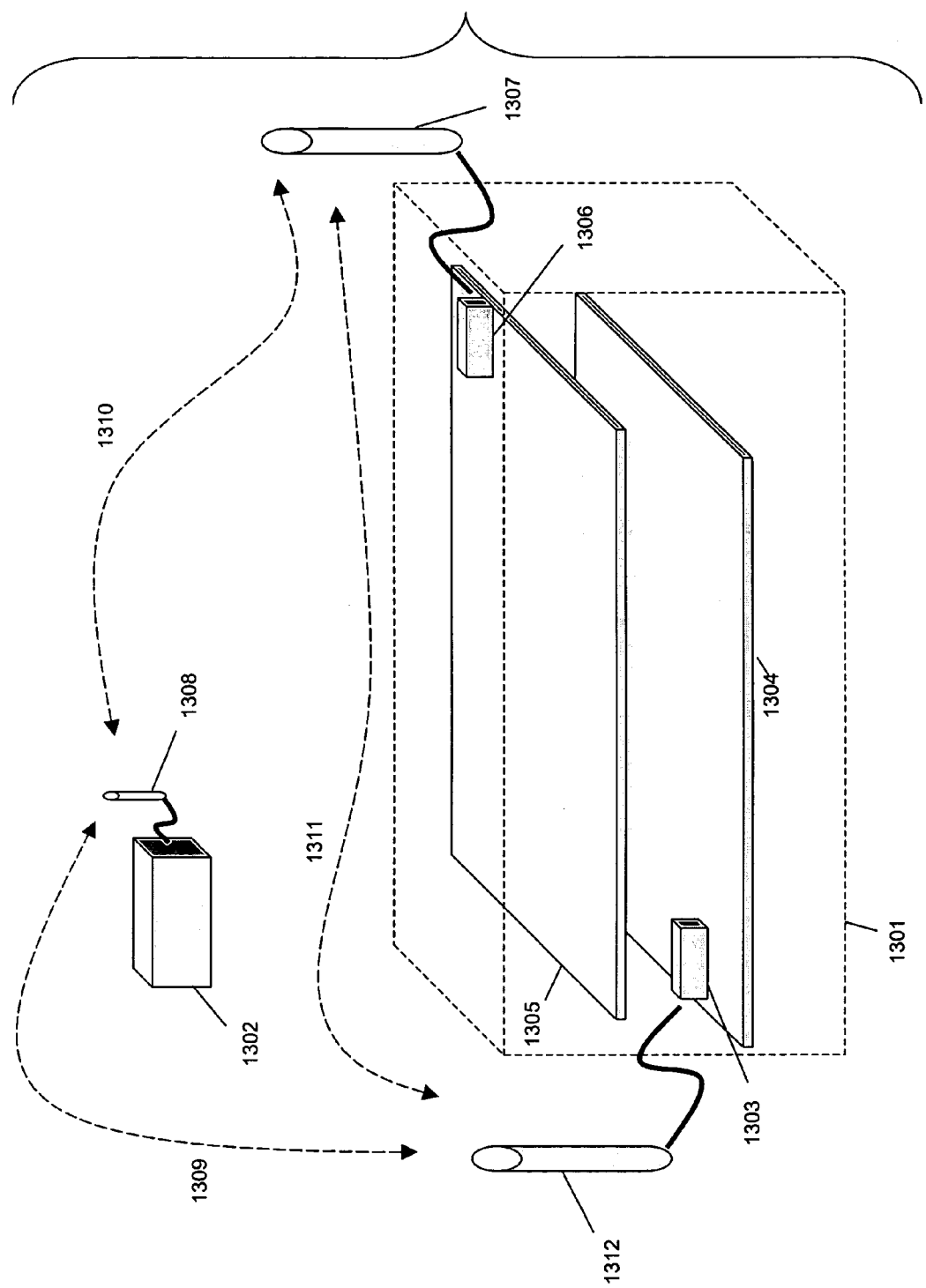
FIG. 13 is a cutaway view of a device having a board having two wireless modules.

In FIG. 13, a device 1301 has one or more component boards 1304, 1305, upon which are mounted two modules 1303 and 1306. The 1303 module is directly connected to the board 1304 using soldered pins. The 1306 module can be mounted on the board 1305 using an intermediate coupling. The modules 1303 and 1306 are able to talk with one another and with a device 1302 in the outside world wirelessly using their respective antenna 1307, 1312 and 1308 via the conventional device to device paths 1309 and 1310 but also by the unconventional path 1311 connecting two points within the same device wirelessly. Path 1311 can be desirable for providing routing flexibility, architectural generality, and digital signal integrity including secure encryption or physical convenience.

The device of FIG. 13 is drawn generically, and is intended to represent any suitable device, including but not limited to Information Technology equipment, electronic communications equipment, networked device appliances or remote management modules, medical or security equipment, industrial monitoring, sensing or control equipment, digital storage or processing devices and equipment and consumer audio or video entertainment components or devices. Such contemplated devices vary tremendously, and for example, can range in size from chip scale components to rack mounted enclosures to room or building sized systems, and in intelligence from basic GPIO signal communication to complete protocol bridging functions or inclusion of management functions such as provision of one or all of MILARRS functions, web services, gateway functions, database access or search, or any other function enabled by wireless local or worldwide network connection.

Thus, specific embodiments and applications of wireless communication ports have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps can be present, or utilized, or combined with other elements, components, or steps that are not expressly referenced.

What is claimed is:

1. A module comprising:
   an electronic component board mountable housing that includes a logic circuitry that translates between a serial communication protocol and a wireless communication protocol;
   a physical connector for connection to a major surface of an electronic component board; and
   an RJ45 connector and an antenna, each of which is electronically coupled to the logic circuitry.

2. The module of claim 1 wherein the housing has a cross-section of an RJ45 connector.

3. The module of claim 1 wherein the physical connector includes pins for attaching an external RJ-45 jack.

4. The module of claim 1 wherein the circuitry is disposed on a single chip.

5. The module of claim 1 wherein the circuitry is split among multiple components.

6. The module of claim 1 further comprising at least 256 Kilobytes of memory that stores an operating system.

7. The module of claim 1 further comprising at least 2 Megabytes of memory that stores at least one web page.

8. The module of claim 1 further comprising a voltage supervisory circuit, and a power feed of no more than 5 Volts.

9. The module of claim 1 wherein the physical connector comprises an array of at least 3 pins.

10. The module of claim 1 wherein the physical connector comprises an array of at least 3 flattened wires.

11. The module of claim 1 further comprising a plurality of general purpose programmable input/output pins (PIO) within the housing.

12. The module of claim 1 wherein the serial communication protocol is selected from the group consisting of Inter-Integrated Circuit ("I2C"), controller Area Network ("CAN"), Process Field Bus ("ProfiBus"), Serial Peripheral Interface ("SPI") and Universal Serial Bus ("USB").

13. The module of claim 1 wherein the wireless communication protocol complies with 802.11x standards.

14. The module of claim 1 wherein the wireless communication protocol is consistent with at least one of Internet Protocol ("IP"), Address Resolution Protocol ("ARP"), User Datagram Protocol ("UDP"), Transmission Control Protocol ("TCP"), Internet Control Message Protocol ("ICMP"), Telephone Network ("Telnet"), Trivial File Transfer Protocol ("TFTP"), Autoconfiguration protocol ("AutoIP"), Dynamic Host Configuration Protocol ("DHCP"), Hyper Text Transfer Protocol ("HTTP"), and Simple Network Management Protocol ("SNNIP").

15. The module of claim 1 further comprising software that provides a security function.

16. The module of claim 15 wherein the software function includes at least one of WEP (Wired Equivalent Protocol) and WPA (Wireless Networking Protected Access) security.

17. The module of claim 1 further comprising software that provides at least one of a MILARRS functionality.

18. The module of claim 1 further comprising software that provides at least one of an email alert and encryption.

19. The module of claim 1 further comprising an antenna wherein the connector to the antenna comprises a coaxial cable, and the antenna is external to the module.

20. The module of claim 1 wherein data transfer or protocol conversion is provided between at least two physical interfaces supported by the module.

21. A device having an electronic component board having a major surface upon which is mounted a first serial to wireless communication module that includes an implementation of a Transfer Control Protocol/Internet Protocol ("TCP/IP") network stack and Operating System ("OS") and an embedded web server.

22. The device of claim 21 wherein the module is soldered to the board.

23. The device of claim 21 wherein the board comprises a flexible substrate.

24. The device of claim 21 further comprising a second serial to wireless communication module that is mounted on the board, and that communicates wirelessly with the first serial to wireless communication module.

25. The device of claim 21 wherein the first serial to wireless communication module communicates to a component off the board using an Ethernet protocol.

* * * * *